US010991641B2

(12) United States Patent
Sutton et al.

(10) Patent No.: US 10,991,641 B2
(45) Date of Patent: Apr. 27, 2021

(54) CANTILEVERED LEADFRAME SUPPORT STRUCTURE FOR MAGNETIC WIRELESS TRANSFER BETWEEN INTEGRATED CIRCUIT DIES

(71) Applicant: Texas Instruments Incorporated, Dallas, TX (US)

(72) Inventors: Benjamin Michael Sutton, Dallas, TX (US); Sreenivasan K Koduri, Allen, TX (US); Subhashish Mukherjee, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/867,352

(22) Filed: May 5, 2020

(65) Prior Publication Data

US 2020/0266131 A1 Aug. 20, 2020

Related U.S. Application Data

(63) Continuation of application No. 14/275,762, filed on May 12, 2014, now Pat. No. 10,643,929.

(51) Int. Cl.
*H01L 23/495* (2006.01)
*H01L 23/522* (2006.01)

(52) U.S. Cl.
CPC .... *H01L 23/49503* (2013.01); *H01L 23/4951* (2013.01); *H01L 23/5227* (2013.01); *H01L 2224/48247* (2013.01); *H01L 2924/0002* (2013.01)

(58) Field of Classification Search
None
See application file for complete search history.

(56) References Cited

U.S. PATENT DOCUMENTS

| 6,265,761 | B1 | 7/2001 | Ghai |
| 7,187,063 | B2 | 3/2007 | Adachi et al. |
| 7,460,000 | B2 | 12/2008 | Kudo et al. |
| 8,195,880 | B2 | 6/2012 | Gai et al. |
| 2001/0045631 | A1 | 11/2001 | Kinsman |
| 2008/0317106 | A1 | 12/2008 | Leung et al. |
| 2009/0146279 | A1 | 6/2009 | Griffin |
| 2009/0160595 | A1 | 6/2009 | Feng |

OTHER PUBLICATIONS

David Krakauer, "Anatomy of a Digital Isolator", Analog Devices, Inc., Technical Article MS-2234, Oct. 2011, pp. 1-3.
Vijaylaxmi Khanolkar, "Multilayer High Voltage Isolation Barrier in an Integrated Circuit", U.S. Appl. No. 14/025,807, filed Sep. 13, 2013, pp. 1-19.

*Primary Examiner* — Steven B Gauthier
(74) *Attorney, Agent, or Firm* — Dawn Jos; Charles A. Brill; Frank D. Cimino

(57) ABSTRACT

A coupling device provides galvanic isolation using a leadframe that is configured to support two integrated circuit chips in a coplanar manner. Each chip contains an inductive coupling coil. The lead frame includes a set of bond pads for attaching bond wires to couple to the two integrated circuit chips. Two separated die attach pads support the two chips. Each die attach pad is configured to support one of the two integrated circuit chips with a plurality of cantilevered fingers.

13 Claims, 8 Drawing Sheets

CANTILEVERED LEADFRAME SUPPORT STRUCTURE FOR MAGNETIC WIRELESS TRANSFER BETWEEN INTEGRATED CIRCUIT DIES

This application is a continuation of U.S. patent application Ser. No. 14/275,762, filed May 12, 2014, the contents of which are herein incorporated by reference in its entirety.

FIELD OF THE INVENTION

This invention generally relates to integrated circuits that provide galvanic isolation between two electrical domains while being able to withstand high voltage, and in particular voltages in excess of 1.5 kv.

BACKGROUND OF THE INVENTION

Galvanic isolation is a principle of isolating functional sections of electrical systems to prevent current flow between the sections. In order to provide galvanic isolation, no direct conduction path is permitted. Energy or information may still be exchanged between the sections by other means, such as capacitance, induction, or electromagnetic waves, or by optical, acoustic, or mechanical means.

Galvanic isolation is used where two or more electric circuits must communicate, but their grounds may be at different potentials. It is an effective method of breaking ground loops by preventing unwanted current from flowing between two units sharing a ground conductor. Galvanic isolation is also used for safety, preventing accidental current from reaching ground through a person's body.

For years, designers of industrial, medical, and other isolated systems had limited options when implementing safety isolation; the only reasonable choice was the optocoupler. Today, digital isolators offer advantages in performance, size, cost, power efficiency, and integration. Isolation imposes constraints such as delays, power consumption, cost, and size. A digital isolator's goal is to meet safety requirements while minimizing incurred penalties.

Optocouplers, a traditional isolator, incur the greatest penalties, consuming high levels of power and typically limiting data rates to below 1 Mbps. More power efficient and higher speed optocouplers are available but impose a higher cost penalty.

Digital isolators using transformer or capacitive coupling have now been available for a number of years and reduce the penalties associated with optocouplers. They may be packaged in a single integrated circuit package and may use CMOS based circuitry to offer significant cost and power savings while significantly improving data rates. Digital isolators typically use foundry CMOS processes and may be limited to materials commonly used in foundries. Nonstandard materials complicate production, resulting in poor manufacturability and higher costs. Common insulating materials include polymers such as polyimide (PI), which can be spun onto a silicon substrate as a thin film, and silicon dioxide ($SiO_2$). Both have well known insulating properties and have been used in standard semiconductor processing for years.

Polymers have been the basis for many digital isolators, giving them an established history as a high voltage insulator. For example, a transformer may be implemented using patterned metal layers on a silicon substrate with polyimide or $SiO_2$ insulation between the metal layers. Current pulses in a primary coil on one layer create magnetic fields to induce current on a secondary coil on a second layer. Similarly, a capacitor may be implemented with thin $SiO_2$ isolation barrier and use capacitive electric fields to couple across the isolation barrier. These types of devices have typically been limited to about 400 V isolation working voltage.

A printed circuit board (PCB) implementation may provide coil windings designed within a PCB layer. These implantations typically have a large footprint and PCB dielectrics may be degraded with moisture conditions, thus limiting isolation barrier capability.

Discrete coil wound transformers are bulky and typically have a high cost. A typical discrete coil wound transformer may provide up to approximately 2.5 kV isolation voltage barrier.

High pressure laminate may be used to provide an insulation barrier between coils of a transformer. A typical laminate based signal transformer may be limited to about 2.5 KV isolation voltage breakdown.

BRIEF DESCRIPTION OF THE DRAWINGS

Particular embodiments in accordance with the invention will now be described, by way of example only, and with reference to the accompanying drawings.

Figure 1:
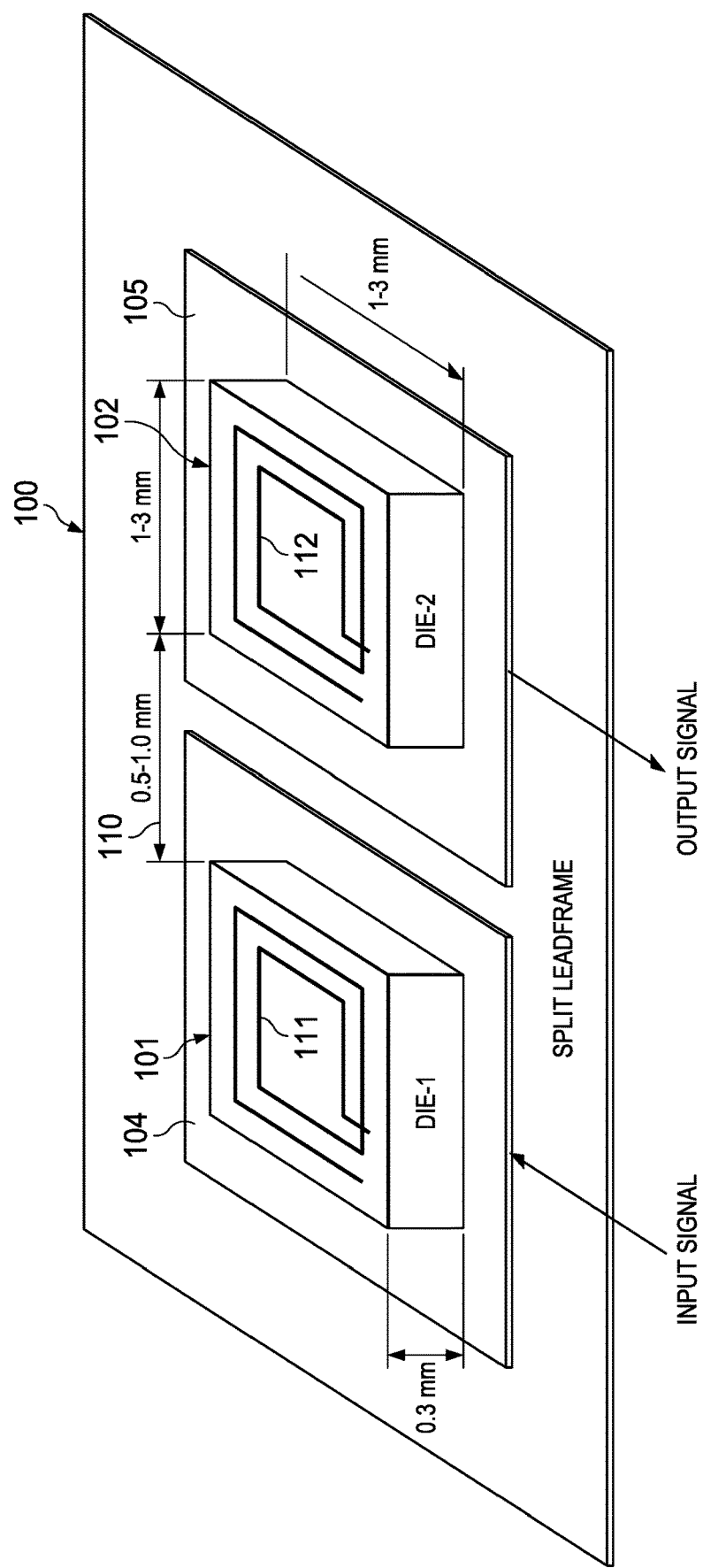
FIG. 1 is a block diagram of a digital isolator that embodies an aspect of the present invention.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

As mentioned above, digital isolators have now been available for a number of years and reduce the penalties associated with optocouplers. They may be packaged in a single integrated circuit package and may use CMOS based circuitry to offer significant cost and power savings while significantly improving data rates. The dominant single chip based technologies are capacitive and inductive (transformer) coupling. Fundamentally, both approaches use two metal plates close to each other (~tens of um) to create a strong coupling, either capacitive or inductive. In the case of transformer inductive coupling, the two plates are patterned to form coils that are positioned in a parallel manner and separated by an insulator. An insulator between the two plates may be an insulator stack, such as CuPIP or Oxide or Laminate which can withstand the voltage difference between the two plates.

Magnetic coupling is an alternative form of coupling in which two coils are positioned on a coplanar arrangement. Previously, magnetic communication for wireless transfer between dies within a single package solution has had limited effectiveness. It has now been discovered that this limited effectiveness due to low coupling and high losses may be caused by eddy currents generated in the silicon substrate of the die and a solid die attach pad. Eddy currents due to ground loops in a solid die attach pad cause extra inductive losses for magnetic power transfer schemes.

Embodiments of the invention may include leadframe design that may provide the following: minimize metal density of the die attach pad, minimize potential ground loops under the die, minimize support structures parallel to communication structures under the die, and maintain mechanical support for manufacturability. Embodiments of the leadframe design may reduce the effects of eddy current losses in the die attach pad while using standard packaging technologies. The use of standard processes and packages with this simple system may enable lower cost digital isolators.

Embodiments of the invention may provide a digital isolator with completely wireless communication between two dies in one package while providing high voltage galvanic isolation. Prior digital isolators typically required three die or two die plus an isolation structure between the two die systems.

FIG. 1 is a block diagram of a digital isolator 100 that embodies an aspect of the present invention. Digital isolator 100 may provide high speed (100's of mbps) coplanar die-to-die wireless communication using magnetic coupling of on-die antenna coils, where the dies 101, 102 are mounted sideways on the same plane to each other. A split leadframe 104, 105 will be described in more detail below. Digital isolator 100 may be packaged as a multichip module (MCM) or may be mounted on the same side of a PCB (printed circuit board), etc., for example.

Dies 101, 102 may each include a coil 111, 112 that may operate as a resonant on-chip LC tank without the need for additional coupling components. High speed die-to-die communication may be established across a gap distance 110 using weak magnetically coupled injection locked tuned oscillators, where k*Q<<1, for example.

The distance 110 between the dies are such that a very high voltage isolation (>1.5 kV, say) can be maintained between the dies. A gap distance 110 that is approximately 0.5 mm or greater, for example, may provide isolation of 1.5 kV or more, for example.

An embodiment of the system may use a carrier frequency in the low GHz range, such as <3 GHz for example, so that large dimension, low cost silicon processes can be used. The system may uses on-chip antenna coils with non-radiative dimensions, where electrical length <carrier/10, for example. The coils may be designed to maximize die-to-die coupling with Q~10 and a self-resonance frequency >3 GHz, for example.

Table 1 provides an example of operating parameters for an embodiment of a digital isolator as described herein. A die-to-die signal link of up to 500 Mb/s may be realized at an aggressive FOM (figure of merit) of <50 pJ/bit.

TABLE 1

| operating parameters for a digital isolator | |
|---|---|
| Specification | Voltage - kVrms |
| Working voltage (kVrms) | 2.5 |
| Surge Voltage (kVpeak) | 24 |
| Ramp to Breakdown (kVrms) | 15 |
| Withstand for 60 s (kVrms) | 10 |

Figure 2:
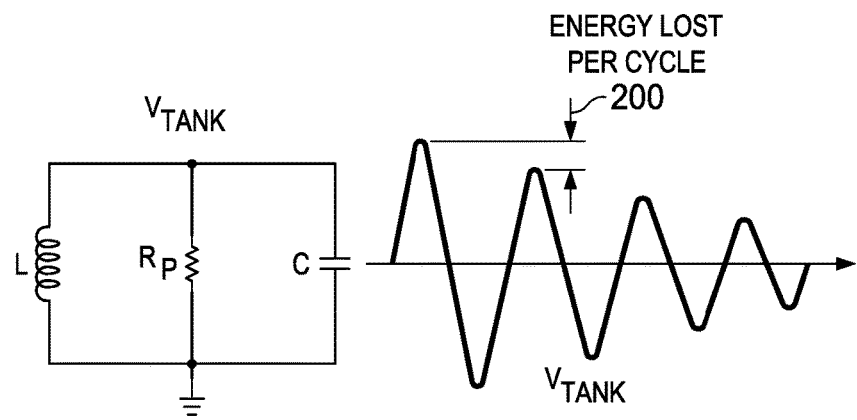
FIG. 2 is a schematic of a simple resonant tank circuit example.

FIG. 2 is a schematic of a simple resonant tank circuit example that includes inductance L from a coil and parasitic and/or point source capacitance C and parallel resistance Rp. Similar to a simple playground swing, in which a single push can get the swing to start to oscillate, a small amount of energy may cause a resonant tank circuit to oscillate. In a swing, the oscillation reduces due to friction; in a tank circuit the oscillation reduces due to resistance Rp as illustrated at 200.

A periodic small push at same frequency can counter the loss of energy due to friction and keep it oscillating or grow in amplitude. Sustained oscillation only requires that just the energy lost per cycle be replenished.

Figure 3:
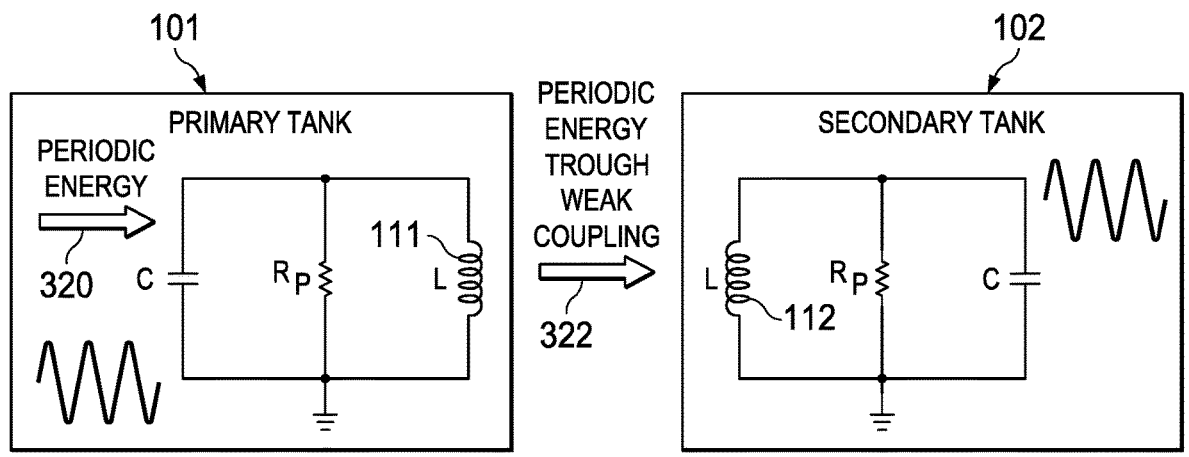
FIG. 3 illustrates the operation of the magnetically coupled digital isolator of FIG. 1.

FIG. 3 illustrates the operation of the magnetically coupled digital isolator of FIG. 1. Periodic pulses of energy 320 may be produced on first chip 101 by on-chip circuitry in response to an input signal and applied to the tank circuit that includes coil 111. The periodic pulses of energy are then coupled to coil 112 in chip 102 through a very weak coupling in sync with oscillation. The driven primary tank on chip 101 is coupled with a secondary tank on chip 102 that is also tuned to the same frequency. Such a system can be made to sustain oscillation for a very low coupling coefficient with reasonable amount of power The amplitude in the two tanks circuits may be controlled by these pulses to thereby transmit information. For example, to achieve a peak swing of 1V at 1 GHz, power needed may be approximately 800 µW, for example. A very small driving power is needed for the secondary tank to sustain oscillation. At steady state, the secondary can be modeled as a driven tank with a driving voltage of k*Vp, where k is the coupling coefficient, as illustrated in equation (1). Solving for the secondary tank voltage VS produces equation (2).

$$VS = k*VP*Q = k*Vin*Q*Q \quad (1)$$

$$VS = k*Vin*Q^2 \quad (2)$$

Thus, for an example Q of 10 (Q is a quality factor, equal to L/R), a voltage amplification of 100× results. This can offset a very low coupling coefficient k.

With the resonant system approach, there is no direct control over the driving current and secondary voltage, which builds up over multiple cycles as discussed above. In order to convey information through digital coupler 100, modulation may be performed using On-Off Keying (OOK), which takes advantage of the settling behavior of the tuned tanks.

Figure 4:
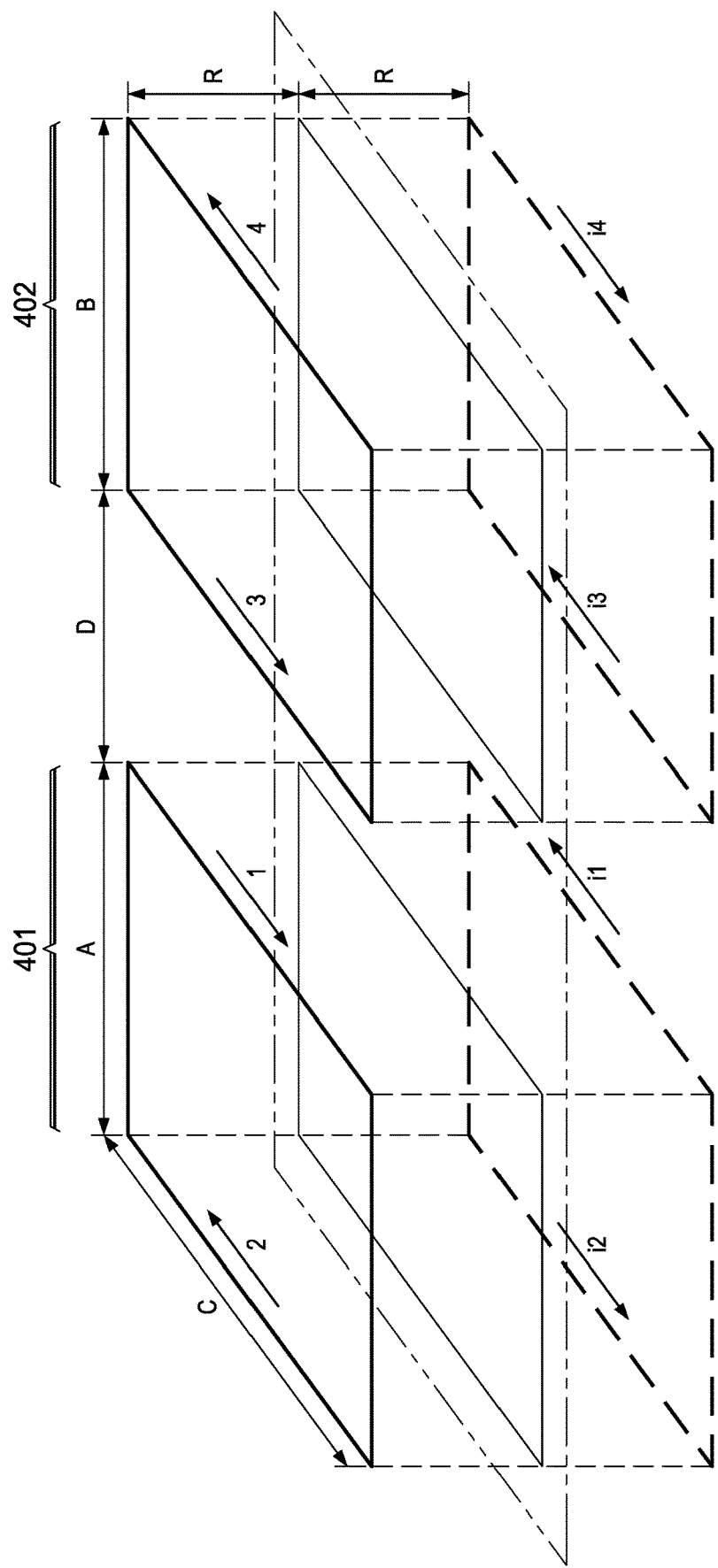
FIG. 4 is an illustration of shadow currents that may form in a solid die attach pad of a digital isolator.

FIG. 4 is an illustration of shadow currents that may form in a solid die attach pad of a digital isolator. Currents i1-i4 are the image currents that may form if the die attach pad is a solid conductive metal plate. The image currents are in opposite direction and therefore they reduce the inductances of the coils in the primary and secondary tank circuits.

The mutual inductance, M, is also a measure of the coupling between two inductors. For example, $M_{21}$ is the mutual inductance, and the subscript specifies the relationship of the voltage induced in coil segment 2 due to the current in coil segment 1. For example, assume the coils have dimensions of: C=2 mm, A=B=2 mm, D=1 mm; and assume the die attach plate has infinite conductivity. Equation (3) illustrates the mutual inductance between coil 401 and 402.

$$M = M_{13} + M_{24} - M14 - M_{23} - M_{i13} + M_{i24} - M_{i14} - M_{i23} \text{ also,} \\ L_1 = L_{1\ in\ air} - M_{i11}, \text{ etc. assume } L_{in\ air} = 1 \text{ nH/mm} \quad (3)$$

R is the distance of the coil above the die attach plate. In this example, for R=0.3 mm, M=0.03 nH and for R=3 mm, M=0.15 nH which illustrates a metal plate in close proximity to the coils will greatly reduce coupling. Referring back to FIG. 1, coils 111 and 112 may be located only 0.3 mm from the die mounting plate, based on the thickness of the chip.

Figure 5:
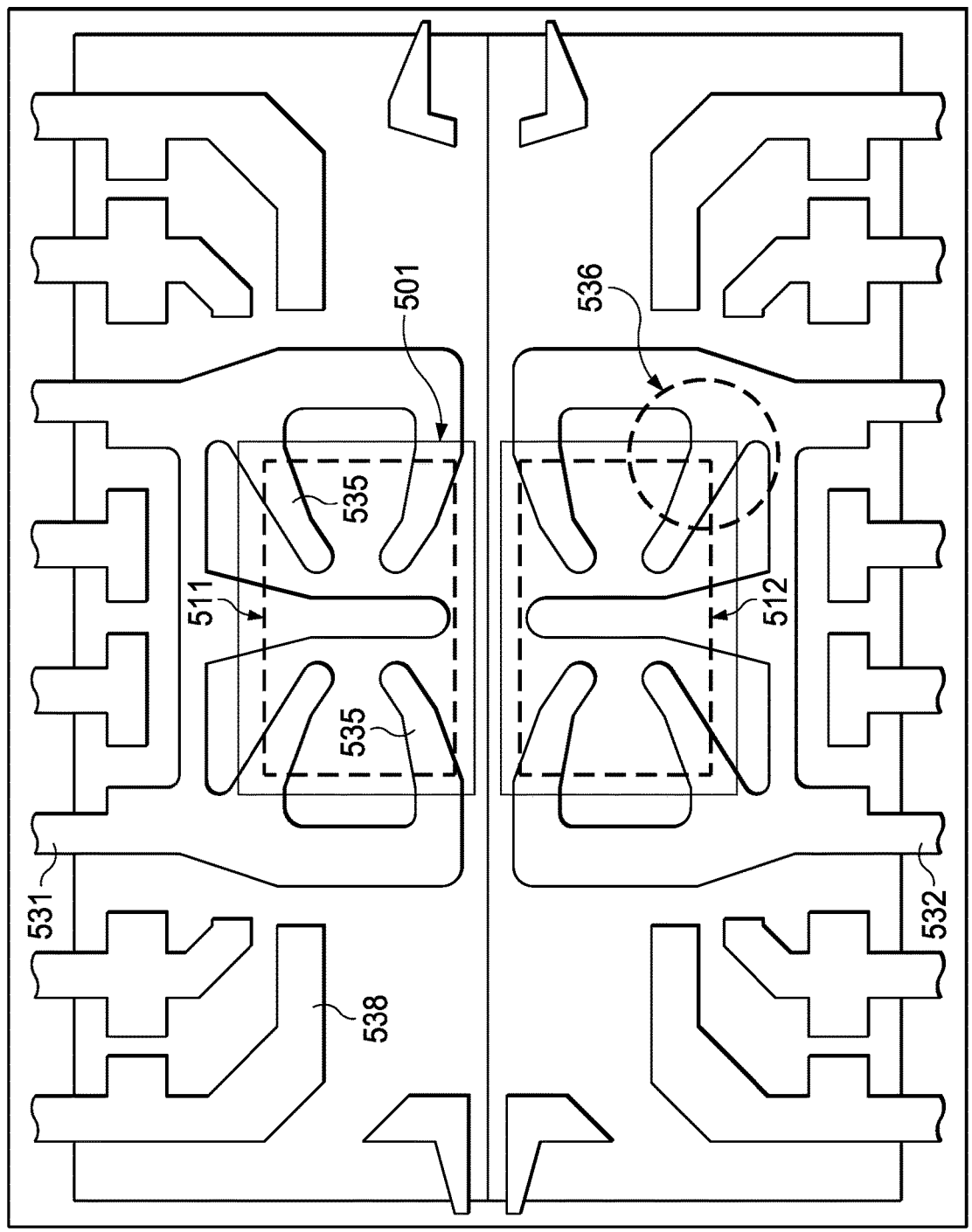
FIGS. 5-7 are examples of cantilevered leadframe support structures for the digital isolator of FIG. 1.
Figure 6:
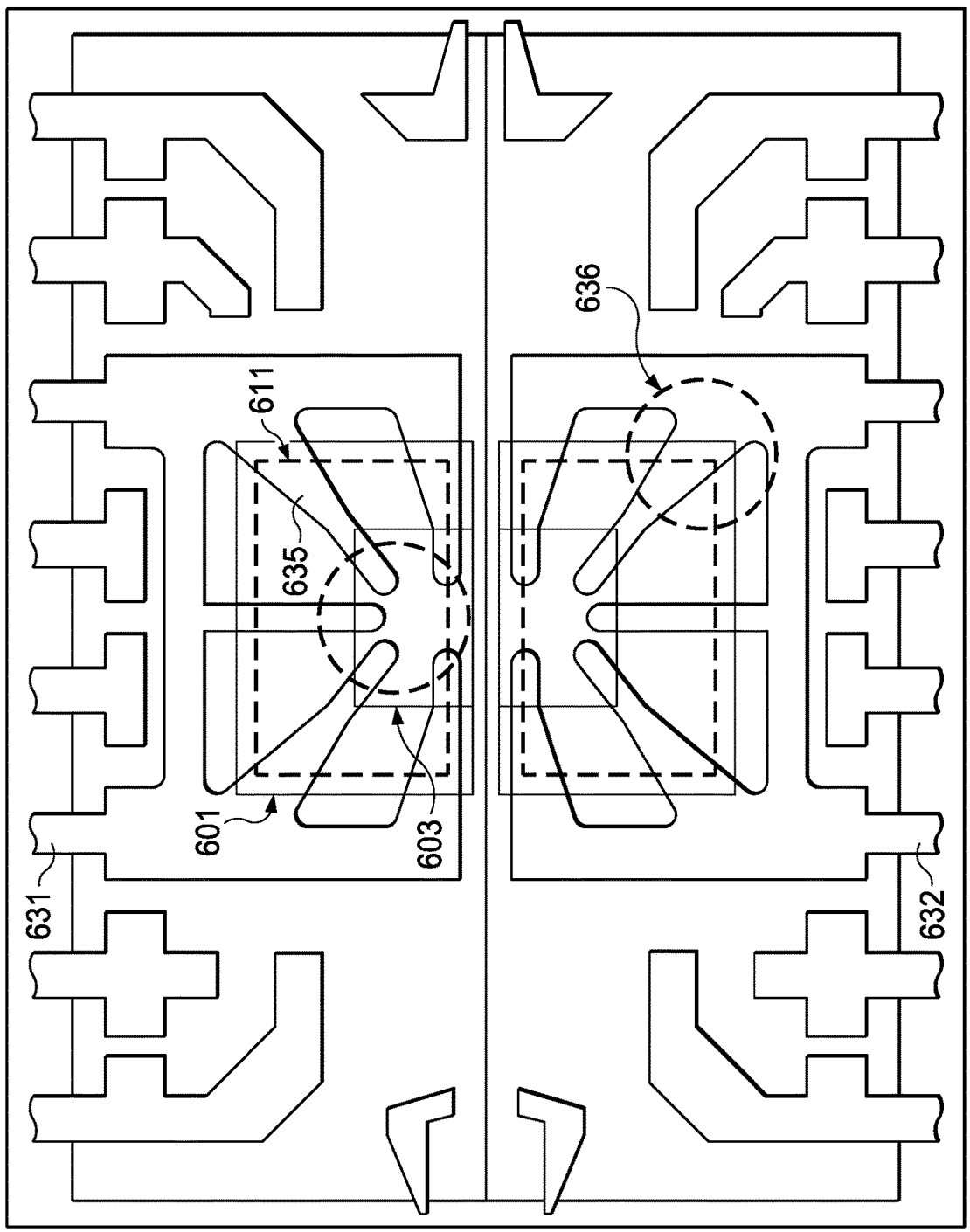
Figure 7:
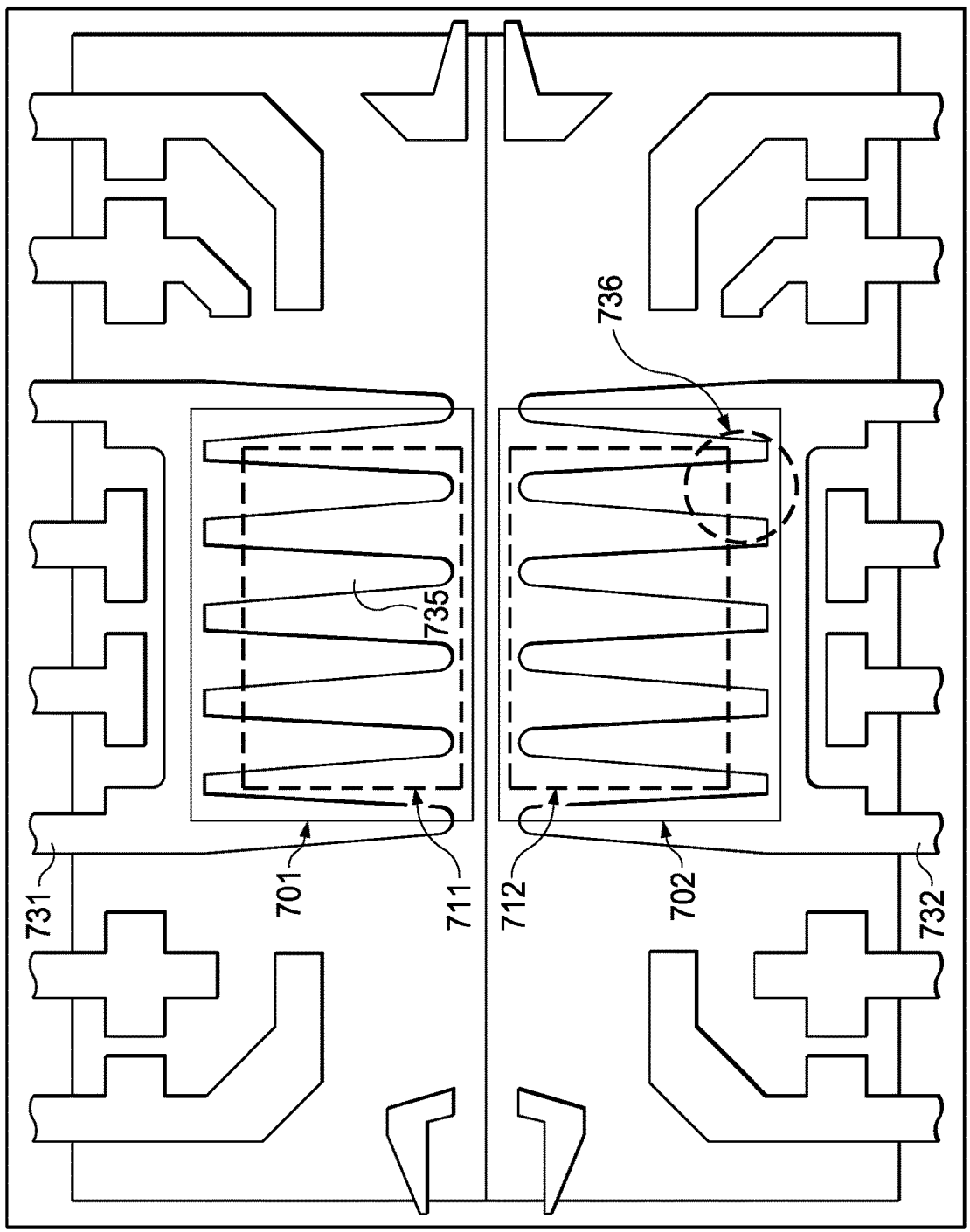

FIGS. 5-7 are examples of cantilevered leadframe support structures for the digital isolator such as illustrated in FIG. 1 that may mitigate the effect of a solid die mounting plate under the tank coils 111, 112. In each example, a leadframe is configured to support two integrated circuit chips that each may contain an inductive coupling coil. The lead frame includes a set of bond pads for attaching bond wires to couple to the two integrated circuit chips and two separated die attach pads. Each die attach pad is configured to support one of the two integrated circuit chips with a set of cantilevered fingers that are configured such that each of the plurality of fingers is oriented approximately perpendicular to an adjacent portion of the inductive coupling coil when the integrated circuit is mounted on the die attach pad.

FIG. 5 illustrates a leadframe with two cantilevered die attach support structures 531, 532 that are designed for a specific die size, such as die 501. Support fingers 535 are arranged to be non-parallel to inductive communication structures, such as coil 511, and cantilevered to avoid ground loops. The term "cantilevered" refers to the fact that only one end of each finger 535 is supported. In this example, each finger 535 includes a wedge shaped region 536 to provide structural rigidity and to improve manufacturability. While five fingers 535 are illustrated here, other embodiments may include more or fewer fingers in each die attach support structure.

In this example, the leadframe also includes several bonding pads and associated lead lines that form a pin external to the finished package, such as bonding pad and lead line 538, that are used for attaching bond wires to couple to an integrated circuit mounted on die attach pad 531, 532, as is well known.

As illustrated, the portion of die attach support structure 531, 532 directly below coils 511, 512 is referred to herein as a designated region for the coil. The cantilevered support structure is configured so that a least a majority of the cantilevered fingers 535 are approximately perpendicular to the designated region for the coil.

FIG. 6 illustrates a leadframe with two cantilevered die attach support structures 631, 632 that are designed for a range of die sizes, such as die 601 or die 603, for example. As long as the coil, such as coil 611, on the die retains a consistent aspect ratio, cantilevered support fingers 635 maintain an approximately perpendicular relationship to the designated region for the coil structure.

In this example, most of the fingers 635 include a wedge shaped region 636 to provide structural rigidity and to improve manufacturability. While five fingers 635 are illustrated here, other embodiments may include more or fewer fingers in each die attach support structure.

In this example, the leadframe also includes several bonding pads and associated lead lines that form a pin external to the finished package that are used for attaching bond wires to couple to an integrated circuit mounted on die attach pad 631, 632, as is well known.

FIG. 7 illustrates a leadframe with two cantilevered die attach support structures 731, 732 that are designed for a range of die sizes, such as die 701, 702, for example. Cantilevered support fingers 735 are arranged to be non-parallel to inductive communication structures, such as coil 711, and cantilevered to avoid ground loops. However, in this embodiment, a portion of coil 711 may be parallel to one or two of the fingers 735, as illustrated. However, a majority of fingers 735 are non-parallel to the designated region of coil structure 711, 712.

In this example, each finger 735 includes a wedge shaped region 736 to provide structural rigidity and to improve manufacturability. While six fingers 735 are illustrated here, other embodiments may include more or fewer fingers in each die attach support structure.

In this example, the leadframe also includes several bonding pads and associated lead lines that form a pin external to the finished package that are used for attaching bond wires to couple to an integrated circuit mounted on die attach pad 731, 732, as is well known.

Figure 8:
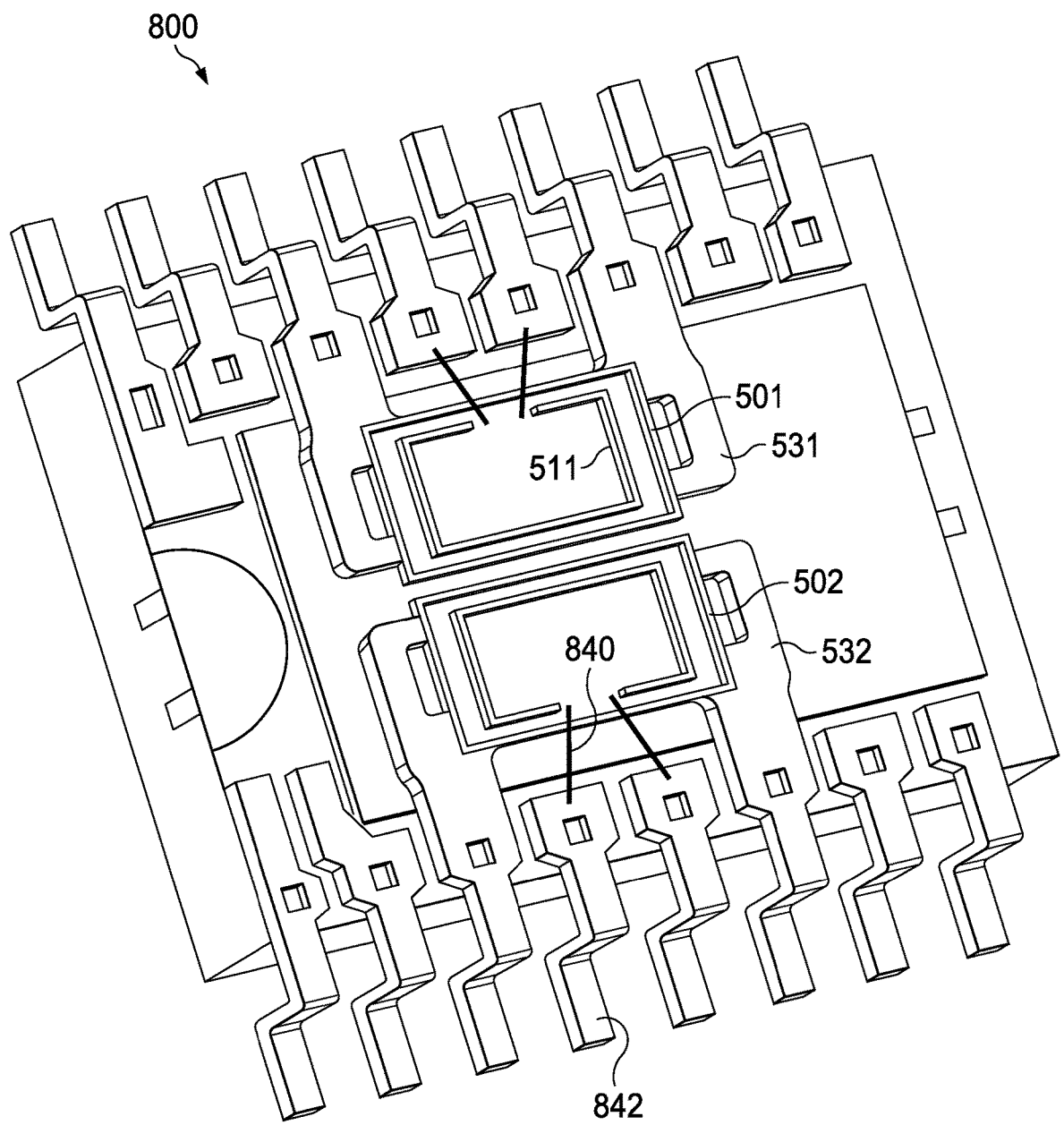
FIG. 8 is an isometric view of a completely packaged isolation device.

FIG. 8 is an isometric view of a completely packaged isolation device 800 that includes the lead frame and chips 501, 502 as illustrated in FIG. 5. Bond wires such as 840 couple between circuitry on each chip and the bond and associated pad-lead line structures that form external package pins such as 842. The entire multichip assembly is then molded with a molding compound to totally encapsulate and protect the isolation device. The general technique of mounting IC's on a lead frame and encapsulation is well known and need not be described in further detail herein.

Digital isolator 800 may be configured to transfer signals conforming to the RS-232, RS-485, or RS-422 standards, for example, by providing appropriate encoding and decoding logic and appropriate input and output circuitry on chips 501, 502. Digital isolator 800 may be configured to transfer other known or later developed signaling standards by providing appropriate receiver and transmitter circuitry and appropriate encoding and decoding logic, for example.

Figure 9:
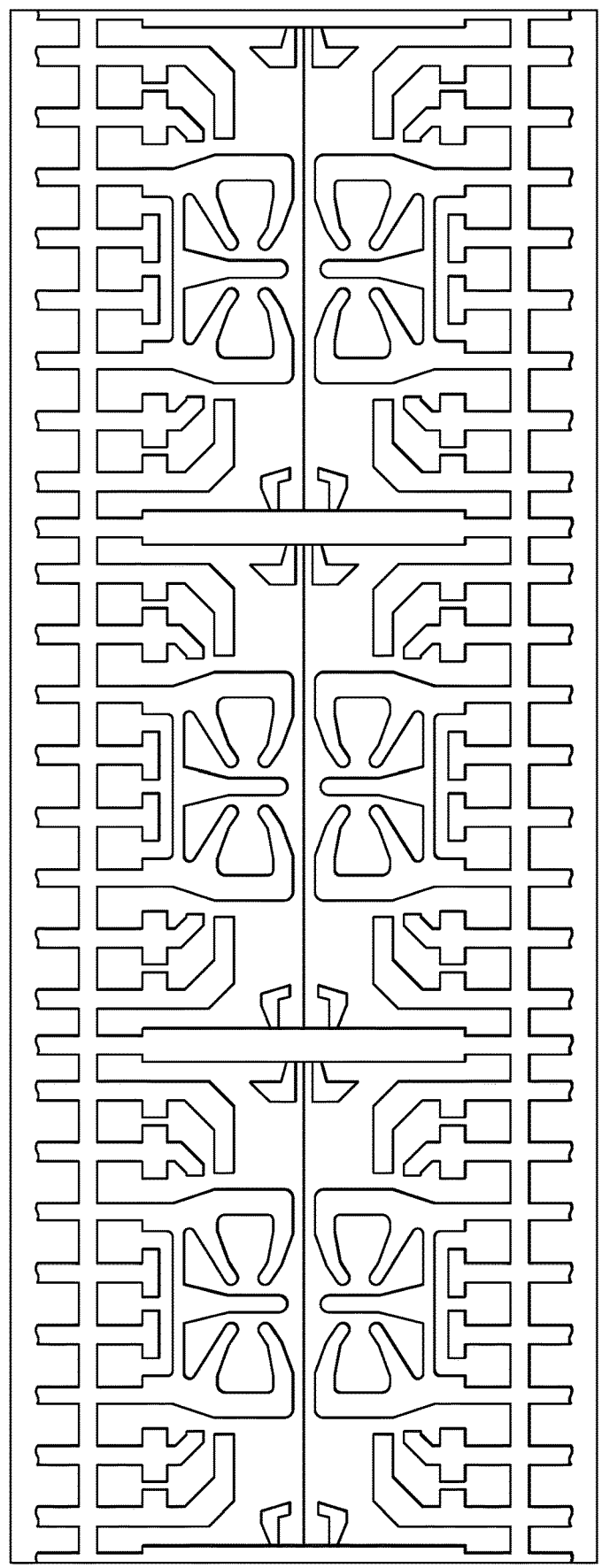
FIG. 9 illustrates a leadframe tape for the leadframe example of FIG. 5.

FIG. 9 illustrates a leadframe tape for the leadframe example of FIG. 5. In this example, three repetitions are illustrated; however, typically a lead frame tape includes hundreds or thousands of individual lead frames. Note, the perimeter "frame" of the lead frame is trimmed off after the device has been molded.

Other Embodiments

While the invention has been described with reference to illustrative embodiments, this description is not intended to be construed in a limiting sense. Various other embodiments of the invention will be apparent to persons skilled in the art upon reference to the description herein.

While several examples of cantilevered support structures where illustrated herein, other configurations may be embodied in which at least a majority of the cantilevered fingers are configured to be non-parallel to the coil structure.

While the same configuration of cantilevered support structure on each half of the lead frame was illustrated herein, some embodiments of a lead frame may have different configurations of cantilevered support structures on each half of the lead frame.

While configurations having five or six cantilevered fingers were illustrated, other embodiments may include fewer or more fingers to accommodate various size chips.

While two integrated circuits that form a single digital coupling device in one molded package were illustrated herein, other embodiments may be more complex. For example, there may be one isolation device for power and a second isolation device for a signal, for example. There may be multiple signal isolation devices included in a single molded package for multiple signals, for example.

While a sixteen pin lead frame was illustrated herein, other embodiments may use lead frames having more, or fewer, pins.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

It is therefore contemplated that the appended claims will cover any such modifications of the embodiments as fall within the true scope and spirit of the invention.

What is claimed is:

1. An integrated circuit package comprising:
   a first die attach pad and a second die attach pad, the first die attach pad including a first set of cantilevered fingers and the second die attach pad including a second set of cantilevered fingers, each of the first set of cantilevered fingers terminating at a first distal end and each of the second set of cantilevered fingers terminating at a second distal end;
   a first die on the first die attach pad, the first die including a first portion on the first distal end, the first die including at least one coil; and
   a second die on the second die attach pad, the second die including a second portion on the second distal end, the second die including at least one coil; wherein each of the first set of cantilevered fingers and each of the second set of cantilevered fingers include five fingers, wherein the distal ends of two fingers of each of the first set of cantilevered fingers and each of the second set of cantilevered fingers are opposite to each other, and wherein one finger extends in a space between the distal ends of the two fingers, wherein a distal end of the one finger is adjacent to an edge along a length of the first die or the second die respectively.

2. The integrated circuit package of claim 1, wherein the first die attach pad and the second die attach pad are cantilevered die attach pads.

3. The integrated circuit package of claim 1, wherein each of the first set of cantilevered fingers is connected to each other within the first die attach pad and each of the second set of cantilevered fingers is connected to each other within the second die attach pad.

4. The integrated circuit package of claim 1, wherein the one finger extends in a direction generally perpendicular to the distal ends of two fingers.

5. The integrated circuit package of claim 1, wherein the first die attach pad and the second die attach pad are cantilevered die attach pads.

6. The integrated circuit package of claim 1, wherein the integrated circuit package functions as a digital isolator.

7. The integrated circuit package of claim 1, wherein voltage isolation between the first die and the second die is more than 1.5 kV.

8. The integrated circuit package of claim 1, wherein the at least one coil is oriented parallel to a plane of a surface along a length of the first die or the second die.

9. The integrated circuit package of claim 1, wherein the first die and the second die are coplanar.

10. The integrated circuit package of claim 1, wherein the first die attach pad and the second die attach pad are coplanar.

11. The integrated circuit package of claim 1, wherein the first die attach pad and the second die attach pad are separated by at least 0.5 mm.

12. The integrated circuit package of claim 1 further comprising molding compound covering portions of the first die attach pad, the second die attach pad, the first die, and the second die.

13. The integrated circuit package of claim 1 further comprising:
   a plurality of bond pads associated with a plurality of lead lines; and
   a plurality of wirebonds, each coupled to the plurality of bond pads and the first die or the second die respectively.

* * * * *